United States Patent
Chang

[19]

[11] Patent Number: 6,097,635
[45] Date of Patent: Aug. 1, 2000

[54] SENSING CIRCUIT FOR PROGRAMMING/READING MULTILEVEL FLASH MEMORY

[75] Inventor: Seung-Ho Chang, Cheongju, Rep. of Korea

[73] Assignee: Hyundai Micro Electronics Co., Ltd., Choongcheongbuk-Do, Rep. of Korea

[21] Appl. No.: 09/379,622

[22] Filed: Aug. 24, 1999

[30] Foreign Application Priority Data

Mar. 27, 1999 [KR] Rep. of Korea ................. 99-10673

[51] Int. Cl.[7] .................................................. G11C 16/06
[52] U.S. Cl. .......................... 365/185.21; 365/185.03; 365/185.2
[58] Field of Search ........................ 365/185.21, 185.2, 365/185.03, 189.07, 189.09, 185.33

[56] References Cited

U.S. PATENT DOCUMENTS 5,596,526  1/1997  Assar et al. .................. 365/185.03
5,917,753  6/1999  Dallabora et al. ............. 365/185.21

Primary Examiner—Huan Hoang
Attorney, Agent, or Firm—Morgan, Lewis & Bockius LLP

[57] ABSTRACT

A sensing circuit for programming/reading a multilevel flash memory includes a voltage controller for controlling a voltage being applied to a drain of a selected cell, a reference voltage generator for generating a reference voltage, a comparator with its one terminal applied by the voltage at the drain connected in common to the PMOS transistor and the NMOS transistor and the other terminal thereof applied by the reference voltage of the reference voltage generator, a sense amplifier driving determinator for determining whether to receive and program 2-bit information during the programming and stopping the operation of the comparator and the voltage controller during completion of the programming, a register array having the same number of registers as the number of information bits of a cell array for one sense amplifier to process so as to provide the 2-bit information to the sense amplifier driving determinator at respective steps during the reading, and a counter unit for generation an 2-bit output for determining the data being stored in the register array at respective steps during the read mode. The circuit employs a simplified sense amplifier using one comparison circuit, thereby decreasing unit area and current consumption.

6 Claims, 7 Drawing Sheets i=1,2,3

DISTRIBUTION

SENSING CIRCUIT FOR PROGRAMMING/READING MULTILEVEL FLASH MEMORY

BACKGROUND OF THE INVENTION

1. Field of the Invention

The present invention relates to a sensing circuit for programming/reading multilevel flash memory, and more particularly, to an improved sensing circuit for programming/reading multilevel flash memory wherein a simplified sense amplifier is employed to maximize the number of sense amplifiers so as to process a plurality of bit data in sequentially processed respective cells in a simplified manner by increasing cell number being processed at one time, thereby enabling a low current operation.

2. Description of the Background Art

A method for programming a multilevel flash memory varies to an iterative program verify technique wherein program and verify are iterated and to an automatic verifying program technique (or simultaneously programming and verifying) wherein all the program requirements are eliminated at the moment of programming while continuously applying a long program pulse until it is completely programmed.

According to the automatic verifying program technique, a cell current variation is detected to determine whether a cell is programmed to a desired extent.

Meanwhile, with regard to a read method of a multilevel flash memory, a sense amplifier having a plurality (level number—1) of comparison circuits are employed to distinguish between respective levers. For example, in order to sense 2 levels (1 bit), a sense amplifier having one comparison circuit is used to sequentially sense while changing the voltage of a control gate.

Here, the program and read should be implemented by identical sense amplifier to maximize the compensation of such as offset in the processing between respective transistors so that it is possible to minimize a cell threshold voltage distribution between respective sense amplifiers.

FIG. 1 is a circuit view illustrating a first example of a sensing circuit for programming/reading a multilevel flash memory according to the conventional art to implement a 4-level sensing. As shown therein, the circuit includes a PMOS transistor PM1 with its source connected to a supply voltage VDD and its gate and drain connected in common so as to be connected to the drain of a selected cell, a reference voltage generator 5 for generating first to third reference voltages VREF1–VREF3, a first to third comparators 1–3 with their each one terminal connected to the drain of the selected cell FMC and the other terminals thereof applied by the first to third reference terminals VREF1–VREF3 for thereby outputting compared results X1–X3, and a decoding unit 4 for decoding the outputs X1–X3 of the first to third comparators 1–3 and outputting 2-bit data MSB, LSB.

The operation of the first example of the sensing circuit for programming/reading the conventional multilevel flash memory will now be described.

As shown in FIG. 2, when a predetermined voltage VG is applied to the control gate of a flash memory cell having a four-threshold voltage distribution, the current ICELL in the cell is also represented in four-current value distributions ICELL1–ICELL4 as shown in FIG. 3. Such current values are converted to voltage and concurrently compared to three reference voltages VREF1–VREF3 using the first to third comparators 1–3. The compared result is decoded by the decoding unit 4 and the information as to where to exist among the four levels is converted to 2-bit data MSB, LSB.

FIG. 4 is a circuit view illustrating a second example of a sensing circuit for programming/reading a conventional multilevel flash memory, wherein four levels are sensed. As shown therein, the circuit includes a PMOS transistor PM11 with its source connected to a supply voltage VDD and its gate and drain connected in common so as to be connected to the drain of a selected cell, a reference voltage generator 13 for generating a reference voltage VREF, a comparator 11 with its one terminal connected to the drain of the selected cell FMC and the other terminal applied by the reference voltage VREF, and a decoding unit 12 for decoding the output of the comparator 11 and outputting 2-bit data MSB, LSB.

The operation of the second example of the sensing circuit for programming/reading the conventional multilevel flash memory will now be described.

As shown in FIG. 5, the intermediate voltage values of the four threshold voltage distributions are sequentially applied to the control gate of the flash memory cell through three steps while increasing or decreasing so that each step determines whether there is a current that runs to the cell by the comparator 11 and detects the moment of current running. Therefore, as shown in FIG. 6, the decoding unit 12 receives the output of the comparator 11 with regard to the information as to where it locates among the four levels and it is converted to 2-bit data MSB, LSB.

FIG. 7 is a circuit view illustrating a third example of the sensing circuit for programming/reading a conventional multilevel flash memory, wherein four levels are sensed. As shown therein, the circuit includes a PMOS transistor PM21 with its source connected to a supply voltage VDD and its gate and drain connected in common so as to be connected to the drain of a selected cell, a comparator 21 with its one terminal connected to the drain of the selected cell and the other terminal applied by a second reference voltage IREF2 and a second comparator 22 with the other terminal applied to a first reference current IREF1 or a third reference current IREF3, a first reference current generator for generating the second reference current IREF2, a second reference current generator 24 for receiving the output X1 of the first comparator 21 and selectively generating the first reference current IREF1 or the third reference current IREF3, and a decoding unit 25 for decoding the outputs X1, X2 of the first and second comparators 21, 22 and outputting 2-bit data MSB, LSB.

The operation of the third example of the sensing circuit for programming/reading the conventional multilevel flash memory will now be described.

As shown in FIG. 8, the cell current ICELL is compared to the second reference current IREF2 so as to determine the upper two or lower two of the four threshold voltage distributions and MSB is determined. The cell current ICELL and the second reference current IREF2 are compared and according to the compared result X1, the second reference current generator 24 selectively outputs the first current IREF1 or the third current IREF3. The first reference current IREF1 or the third reference current IREF3 selectively outputted by the cell current ICELL and the second reference current generator 24 is compared in the second comparator 22 to determined the most significant bit LSB.

Likewise, the conventional sensing circuit for programming/reading a multilevel flash memory employs repetition of programming and verifying, so that the lower the threshold voltage of the cell during the sensing, the more current flows, thereby increasing memory consumption and circuit size.

SUMMARY OF THE INVENTION

The present invention is directed to overcoming the conventional disadvantages.

Therefore, it is an object of the present invention to provide a sensing circuit for programming/reading a multilevel flash memory which increases cell number for processing at a single time by increasing the number of the entire sense amplifiers using a simplified sense amplifier to sequentially program/read respective levels, decrease a current consumption using a previous data stored in a register when reading by not driving sense amplifiers without requiring sensing, and simplifies the process using a level value storage technique instead of operating a plurality of sequentially processed bit information at respective levels.

To achieve the above-described object, there is provided a sensing circuit for programming/reading a multilevel flash memory according to the present invention which includes a voltage controller for controlling a voltage being applied to a drain of a selected cell, a PMOS transistor with a programming voltage applied to a source thereof and its gate and drain connected in common, an NMOS transistor with its drain connected to a drain of the PMOS transistor, its gate connected to an output terminal of the voltage controller and its source connected to a drain of the selected cell, a reference voltage generator for generating a reference voltage, a comparator with its one terminal applied by the voltage at the drain connected in common to the PMOS transistor and the NMOS transistor and the other terminal thereof applied by the reference voltage of the reference voltage generator, a sense amplifier driving determinator for determining whether to receive and program 2-bit information during the programming and stopping the operation of the comparator and the voltage controller during completion of the programming, a register array having the same number of registers as the number of information bits of a cell array for one sense amplifier to process so as to provide the 2-bit information to the sense amplifier driving determinator at respective steps during the reading, and a counter unit for generation an 2-bit output for determining the data being stored in the register array at respective steps during the read mode.

The features and advantages of the present invention will become more readily apparent from the detailed description given hereinafter. However, it should be understood that the detailed description and specific example, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

With reference to the accompanying drawings, the preferred embodiments of the present invention will now be described.

Figure 1:
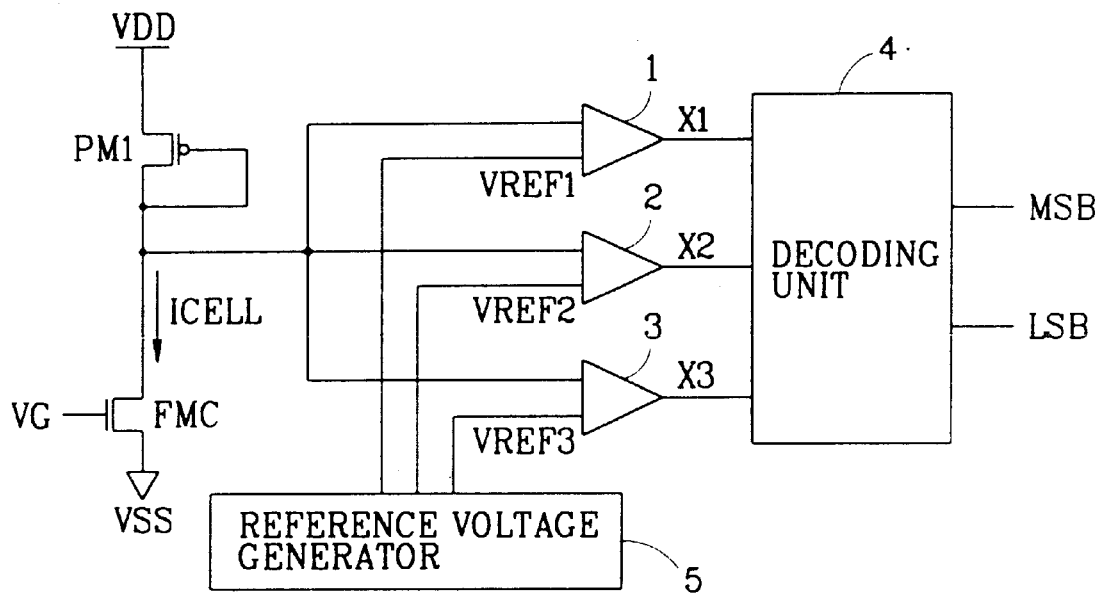
FIG. 1 is a circuit view illustrating a first example of a sensing circuit for programming/reading a multilevel flash memory.
Figure 2:
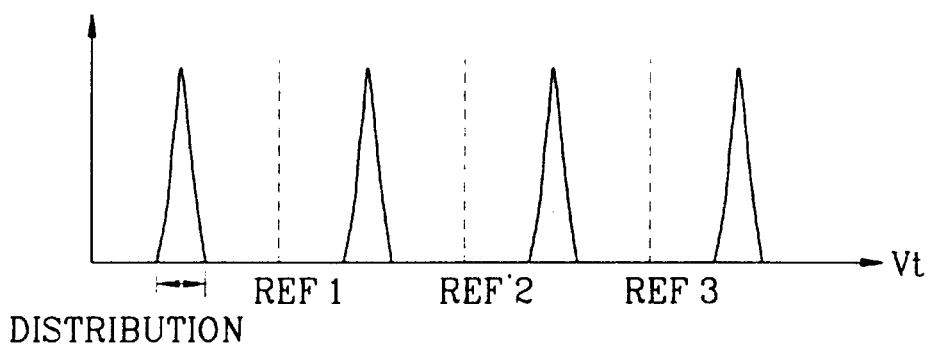
FIG. 2 is a graph illustrating a threshold voltage distribution of the multilevel flash memory cell in the circuit view of FIG. 1.
Figure 3:
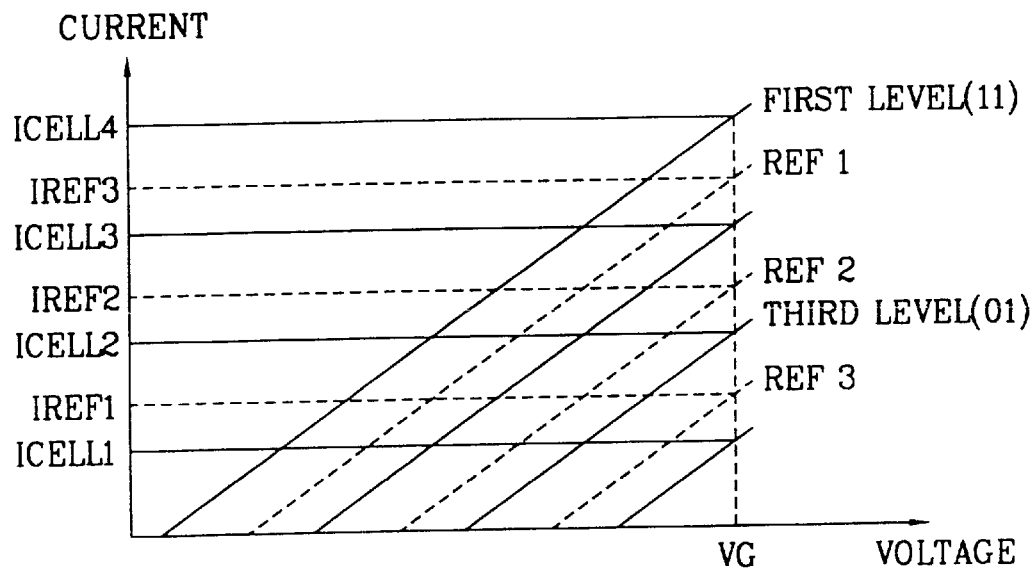
FIG. 3 is a graph illustrating a cell current distribution of the multilevel flash memory cell in the circuit view of FIG. 1.
Figure 4:
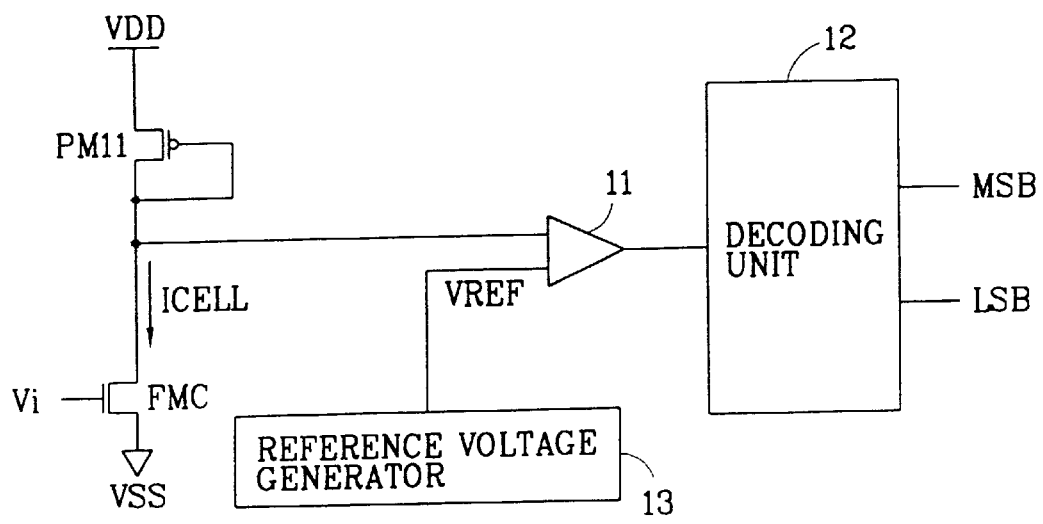
FIG. 4 is a circuit view illustrating a second example of a sensing circuit for programming/reading a conventional multilevel flash memory.
Figure 5:
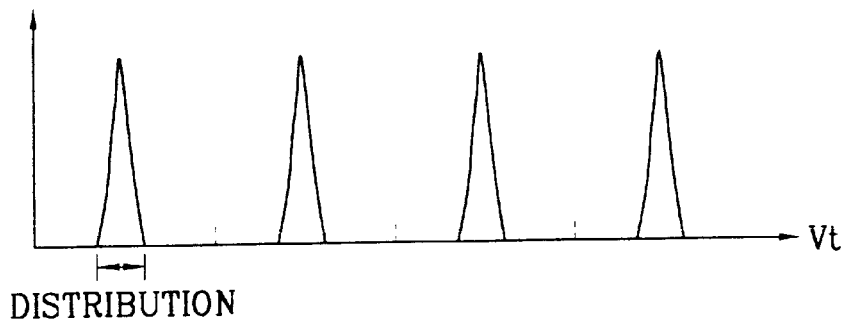
FIG. 5 is a graph illustrating a threshold voltage distribution of the multilevel flash memory cell in the circuit of FIG. 4.
Figure 6:
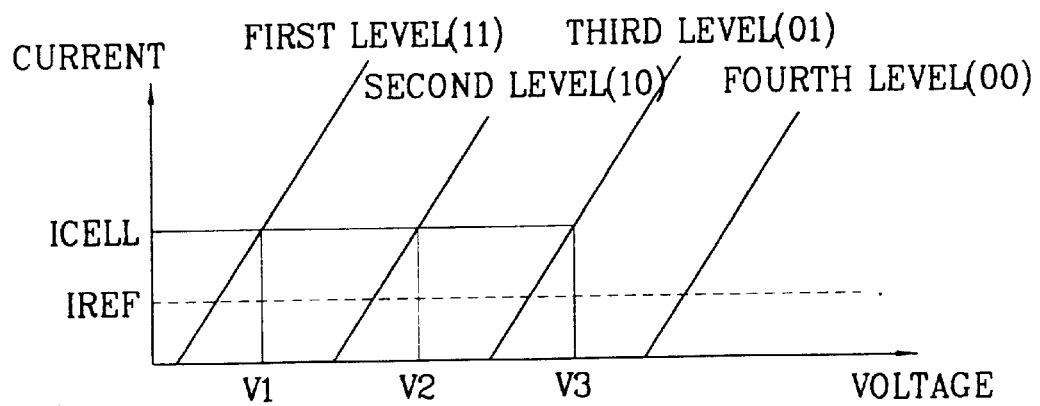
FIG. 6 is a graph illustrating a cell current of the multilevel flash memory cell in the circuit of FIG. 4.
Figure 7:
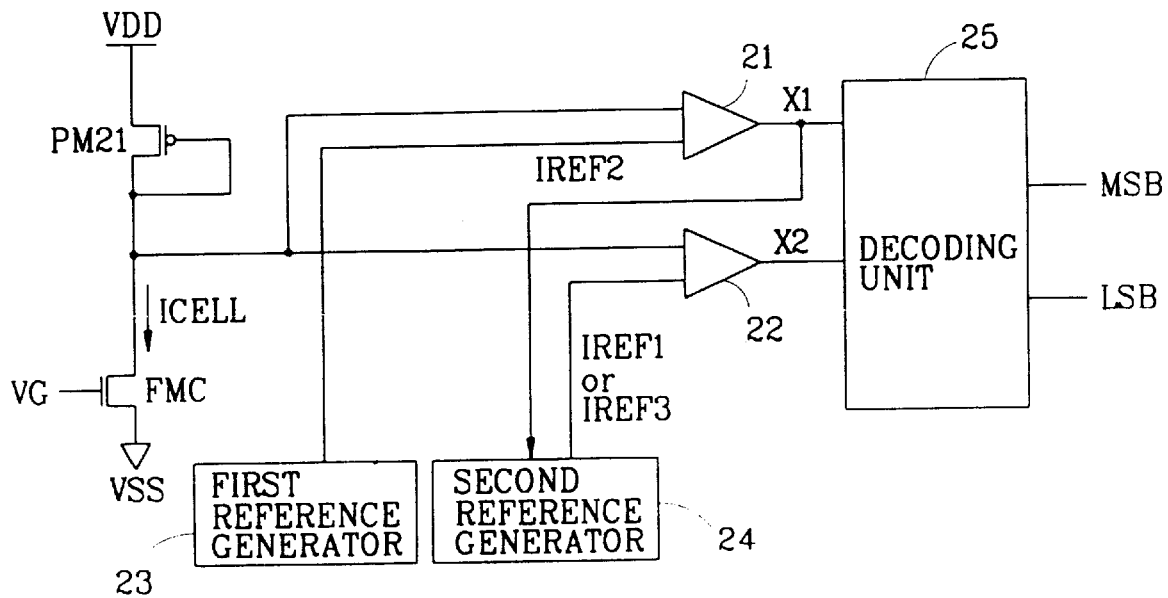
FIG. 7 is a circuit view illustrating a third example of a sensing circuit for programming/reading a conventional multilevel flash memory.
Figure 8:
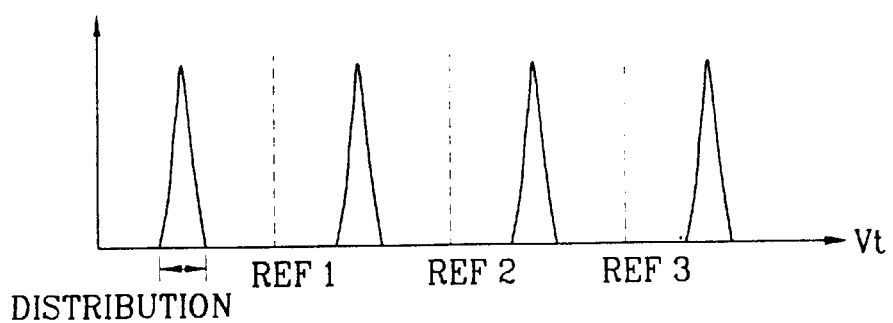
FIG. 8 is a graph illustrating a threshold voltage distribution of the multilevel flash memory cell in the circuit of FIG. 7.
Figure 9:
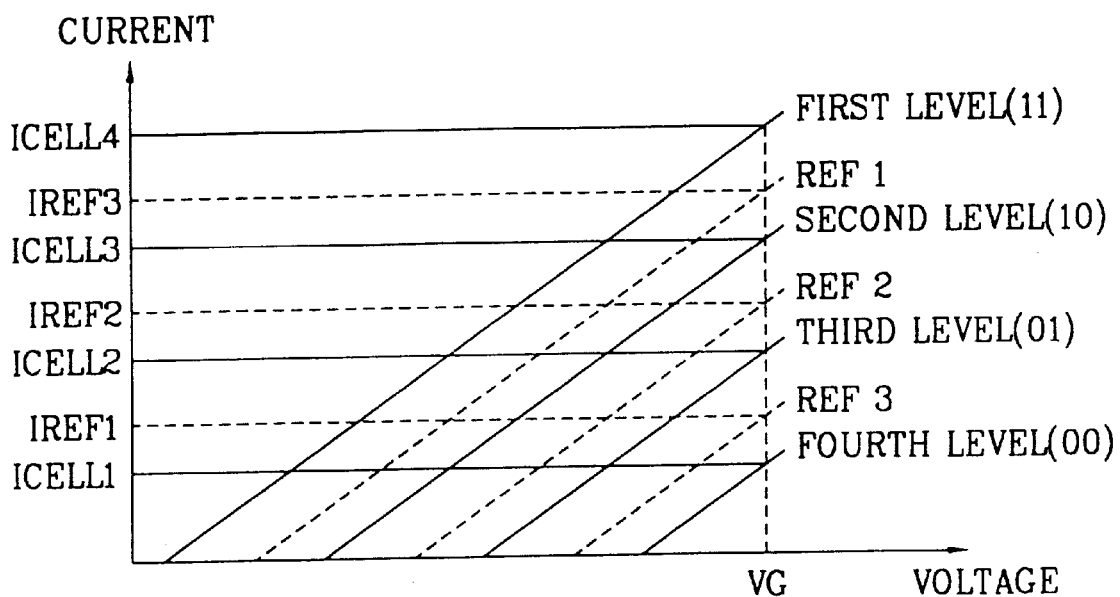
FIG. 9 is a graph illustrating a cell current of the multilevel flash memory cell in the circuit of FIG. 7.
Figure 10:
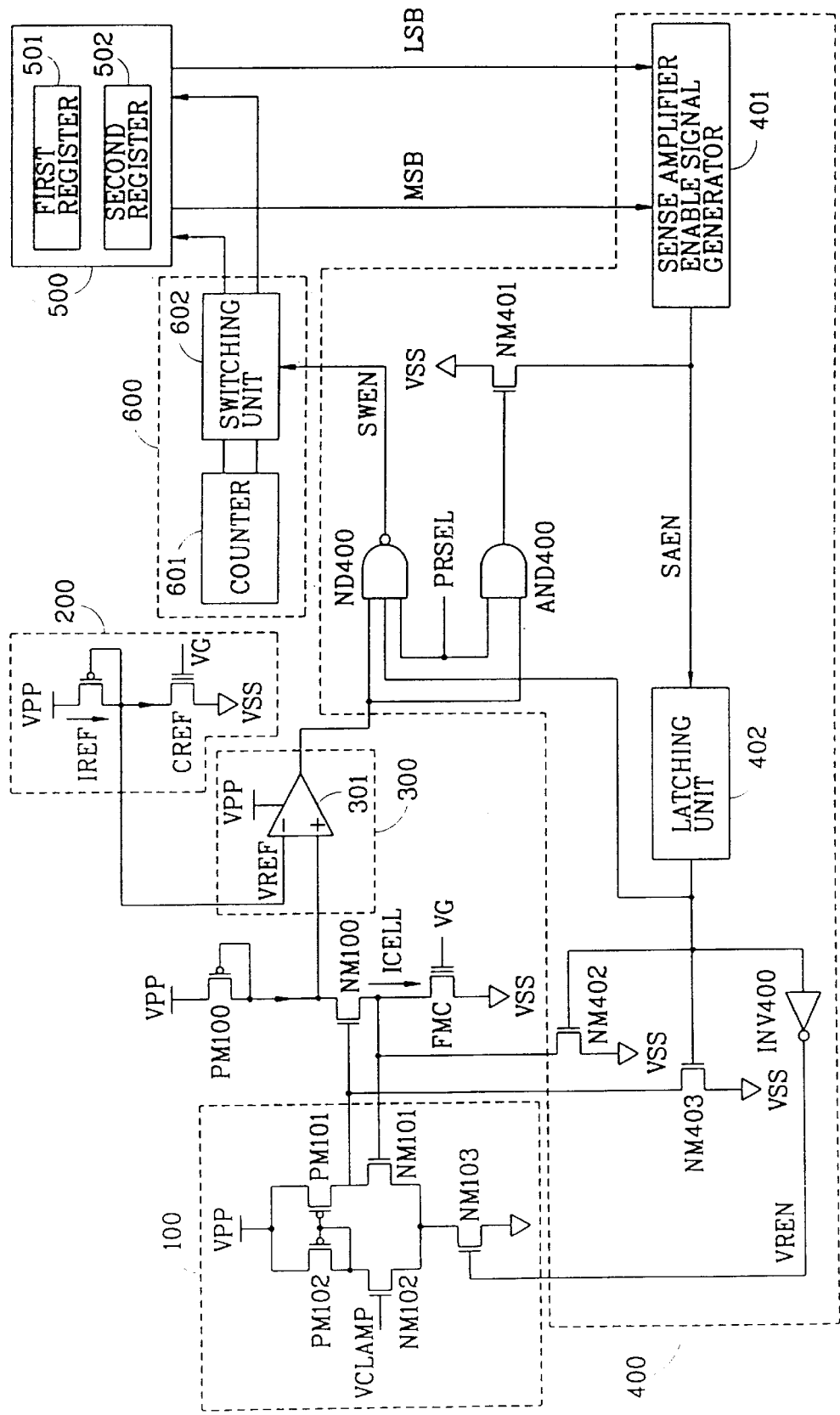
FIG. 10 is a circuit view illustrating a sensing circuit for programming/reading a multilevel flash memory according to the present invention.

FIG. 10 is a circuit view illustrating a sensing circuit for programming/reading a multilevel flash memory according to the present invention, wherein there is provided a sensing circuit for 4-level sensing. As shown therein, the circuit includes a voltage controller 100 for controlling the voltage being applied to a drain of a selected cell FMC, a PMOS transistor PM100 with a programming voltage VPP applied to the source thereof and its gate and drain connected in common, an NMOS transistor NM100 with its drain connected to a drain of the PMOS transistor PM100, its gate connected to an output terminal of the voltage controller 100 and its source connected to a drain of the selected cell FMC, a reference voltage generator 200 for generating a reference voltage VREF, a comparator 300 with its one terminal applied by the voltage at the drain connected in common to the PMOS transistor PM100 and the NMOS transistor NM100 and the other terminal thereof applied by the reference voltage VREF of the reference voltage generator 200, a sense amplifier driving determinator 400 for determining whether to receive and program 2-bit information MSB, LSB during the programming and stopping the operation of the comparator 300 and the voltage controller 100 during completion of the programming, a register array 500 having the same number of registers 501, 502 as the number of information bits of a cell array for one sense amplifier to process so as to provide the 2-bit information to the sense amplifier driving determinator 400 at respective steps during the reading, and a counter unit 600 for generation an 2-bit output for determining the data being stored in the register array 500 at respective steps during the read mode.

The voltage controller 100 includes a first PMOS transistor PM101 with its source applied by the programming voltage VPP and its gate connected in common, a second PMOS transistor PM102 with its gate and drain connected in common, a first NMOS transistor NM101 with its gate connected to the drain of the selected cell FMC and its drain connected to the drain of the first PMOS transistor PM101, a second NMOS transistor NM102 with its gate applied by a clamp voltage VCLMP and its drain connected to the drain of the second PMOS transistor PM102, and a third NMOS transistor NM103 with its gate applied by a voltage control enable signal VREN, its drain connected to the source of the first NMOS transistor NM101 and the second NMOS transistor NM102 connected in common by the source and its source connected to ground voltage VSS.

The reference voltage generator 200 includes a PMOS transistor PM200 with its source applied to the programming voltage VPP, its gate and drain connected in common to an input terminal of the comparator 300, and its drain connected to the drain of the reference cell CREF, and a reference cell CREF with its gate applied to a control gate voltage VG, its drain connected to the drain of the PMOS transistor PM200 and its source connected to ground voltage VSS.

The comparator 300 is driven by the programming voltage VPP and included a differential amplifier 301 with its one terminal applied by the reference voltage VREF of the reference voltage generator 200 and the other terminal thereof applied by a cell voltage VCELL.

The sense amplifier driving determinator 400 includes a sense amplifier enable signal generator 401 for receiving 2-bit data MSB, LSB from the register array 500 during the programming and outputting a sense amplifier enable signal SAEN, a latch unit 402 for latching the sense amplifier enable signal SAEN of the sense amplifier enable signal generator 401, a NAND gate ND400 for NANDing an output of the comparator 300, an output of the latch unit 402 and a programming/reading mode selection signal PRSEL and outputting a switching enable signal SWEN, an AND gate AND400 for ANDing an output of the comparator 300 and the programming/reading mode selection signal PRSEL, a first NMOS transistor NM401 with its drain applied by the sense amplifier enable signal SAEN, its gate applied by an output of the AND gate AND400 and its source connected to the ground voltage VSS, a second NMOS transistor with its gate applied by the output of the latch unit 402, its drain connected to the gate of the second NMOS transistor NM102 of the voltage controller 100 and its source connected to the ground voltage VSS, a third NMOS transistor NM403 with its gate applied by the output of the latch unit 402, its drain applied to the gate of the NMOS transistor NM100 and its source applied to the ground voltage VSS, and an inverter INV400 for inverting the output of the latch unit 402 and outputting the voltage control enable signal VREN.

Figure 11:
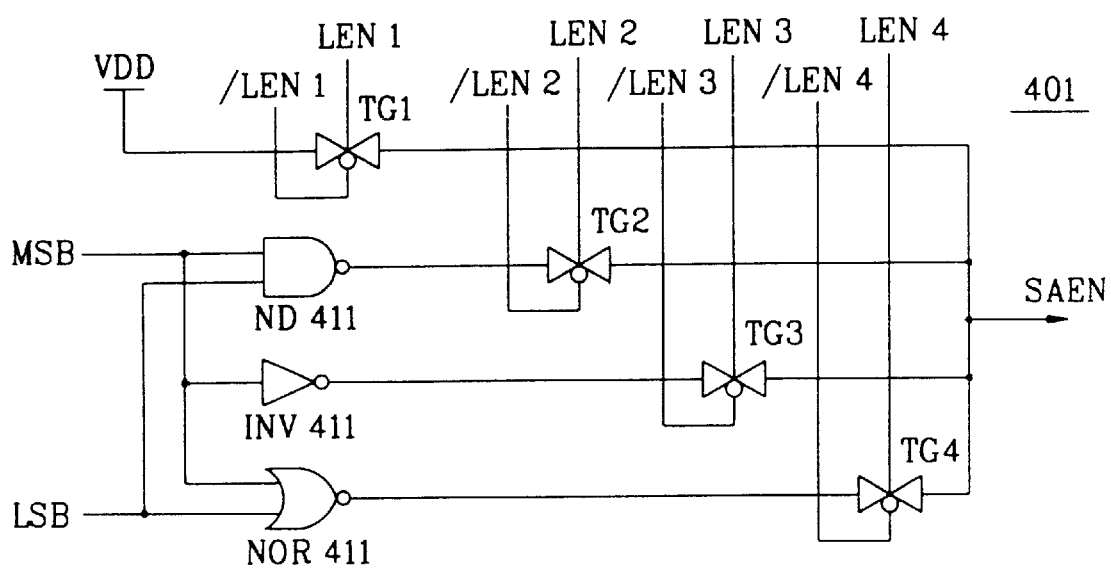
FIG. 11 is a circuit view illustrating a sense amplifier enable signal generator in the circuit of FIG. 10.

The sense amplifier enable signal generator 410, as shown in FIG. 11, includes a first transmission gate TG1 for being controlled by a first level enable signa LEN1 and its inverted signal /LEN1 and selectively outputting the supply voltage VDD, a NAND gate ND411 for NANDing the most significant bit MSB and the least significant bit LSB of the register array 500, a second transmission gate TG2 for controlling the output of the NAND gate ND411 by the second level enable signal LEN2 and its inverted signal /LEN2 and selectively outputting the result, an inverter INV411 for inverting the most significant bit MSB, a third transmission gate TG3 for controlling the output of the inverter INV411 by the third level enable signal LEN3 and its inverted signal /LEN3 and selectively outputting the result, a NOR gate NOR411 for NORing the most significant bit MSB and the least significant bit LSB, and a fourth transmission gate TG4 for controlling the output of the NOR gate NOR411 by the fourth level enable signal LEN4 and its inverted signal /LEN4 and selectively outputting the result.

The counter unit 600 includes a counter 601 for performing a real counting, and a switching unit 602 for being controlled by the switching enable signal SWEN of the sense amplifier driving determinator 400 and selectively outputting the output of the counter 601.

The operation of the thusly constituted sensing circuit for programming/reading a multilevel flash memory according to the present invention will now be described.

The sensing circuit for programming/reading a multilevel flash memory requires a 4-step programming operation and a 3-step reading operation when programming/reading a flash memory array having four levels.

First, during the programming, the control gate voltage VG increases at respective steps and the reference current IREF is identically maintained and the programming is carried out while the threshold voltage of the cell is increased. The data stored in the respective registers 501, 502 of the register array 500 at the respective steps are repeatedly read and the programming is performed by determining whether to implement the program at a level corresponding to the data.

If the data is "11", the program is implemented at the first step, if the data is "10", the program is carried out at the first and second steps. If "01", the program is carried out at first, second and third steps, and if "00", the program is carried out at first, second, third and fourth steps. The moment the threshold voltage of each cell is increased and the cell current ICELL becomes lower than the reference current IREF, the program is stopped by the output VREN of the second and third transistors NM402, NM403 and the inverter INV400 of the sense amplifier driving determinator 400.

Meanwhile, during the reading operation, the first level is sensed at the first step and distinguished from the second, third and fourth levels. The second level is sensed at the second step and distinguished from the third and fourth levels. The third level is sensed at the third step and the cell which has not been sensed yet is distinguished as fourth level.

Such a reading operation will now bed explained in further detail.

In the first step, all the resisters 501, 501 are reset as "00" and the output of the counter 600 as "11", and the control gate voltage VG of the cell is set as first voltage V1. Then, if the threshold voltage of the selective cell is lower than the threshold voltage of the reference cell, the output of the counter unit 600 is stored in the register array 500, and if the threshold voltage of the selected cell is higher than the threshold voltage of the reference cell, the register array 500 maintains the data stored as "00". Here, the first voltage V1 is set to be higher than the threshold voltage of the first level cell and lower than the respective threshold voltages of the second, third and fourth level cells and the reference cell.

In the second step, the output of the counter unit 600 is set as "10". After the control gate voltage VG of the cell is increased to the second voltage V2, a number CN of columns of the cell connected to the sense amplifier are sequentially sensed. In the respective columns, the preset data of the corresponding register is read. When the preset data is "11", the sense amplifier is not operated and the output of the sense amplifier is floated and the switching unit 601 of the counter unit 600 is interrupted so that the output of the counting unit 600 is not stored in the register array 500. If the present data is not "11", the sensing operation is carried out. At this time, when the threshold voltage of the selected cell is lower than the threshold voltage of the reference cell, the output of the sense amplifier as the second level cell is turned to a high level so that the output "10" of the counter unit 600 is stored in the register array 500. When the threshold voltage of the selected cell is higher than the threshold voltage of the reference cell, the output of the sense amplifier as third or fourth level cell becomes a low level. Accordingly, the switching unit 601 of the counter unit 600 is interrupted so that the output of the counter unit 600 is not stored in the register array 500.

All the sense amplifiers of the memory array perform the above process CN times the number of the cell columns, thereby finishing the second step. The first and second level cells of the respective registers 501, 502 of the register array 500 are sensed and recorded, and the rest maintains the state reset as "00".

Also, in the third step, the output of the counter unit 600 is set as "01". After the control gate voltage VG of the cell is increased to the third voltage V3, a number CN of columns of the cell connected to the sense amplifier are sequentially sensed. In the respective columns, the preset data of the corresponding register is read. When the preset data is "11" or "10", the sense amplifier is not operated and the output of the sense amplifier is floated and the switching unit 601 of the counter unit 600 is interrupted so that the output of the counting unit 600 is not stored in the register array 500. If the present data is not "11" or "10", the sensing operation is carried out. At this time, when the threshold voltage of the selected cell is lower than the threshold voltage of the reference cell, the output of the sense amplifier as the third level cell is turned to a high level so that the output "01" of the counter unit 600 is stored in the register array 500. When the threshold voltage of the selected cell is higher than the threshold voltage of the reference cell, the output of the sense amplifier as fourth level cell becomes a low level. Accordingly, the switching unit 601 of the counter unit 600 is interrupted so that the output of the counter unit 600 is not stored in the register array 500.

All the sense amplifiers of the memory array perform the above process CN times the number of the cell columns, thereby finishing the third step. The first, second and third level cells of the respective registers 501, 502 of the register array 500 are sensed and recorded, and the rest maintains the state reset as "00", that is, the fourth level cell.

In the above, a four-level (2 bits) cell is described with regard to the sensing circuit for programming/reading a multilevel flash memory. However, in case of more than four levels, it is possible to apply a more than 2-bit data in one cell to the flash memory cell array if the bit number of the counter unit 600 becomes identical to the number of cell bits and the number of steps is less than the level number of the cell by one.

Likewise, the sensing circuit for programming/reading a multilevel flash memory according to the present invention employs a simplified sense amplifier using one comparison circuit, thereby decreasing unit area and current consumption.

Further, the data of the present step while sensing respective steps is compared to the previous data stored in the register to employ the sense amplifier driving determinator so that the sense amplifier without performing the sensing is not operated, whereby the operation current is decreased and the data processing is not relied on the complicated operation and instead the output of the counter unit is sent to the register or maintains the previous level data in accordance with the sensing result of the sensing circuit, thereby enabling the data processing. Therefore, since many sense amplifiers may be provided within the memory chip, the data throughput is improved by increasing the cell number being simultaneously processed.

As the present invention may be embodied in various forms without departing from the spirit of the essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within meets and bounds of the claims, or equivalences of such meets and bounds are therefore intended to be embraced by the appended claims.

What is claimed is:

1. A sensing circuit for programming/reading a multilevel flash memory, comprising:

a voltage controller for controlling a voltage being applied to a drain of a selected cell;

a PMOS transistor with a programming voltage applied to a source thereof and its gate and drain connected in common, an NMOS transistor with its drain connected to a drain of the PMOS transistor, its gate connected to an output terminal of the voltage controller and its source connected to a drain of the selected cell;

a reference voltage generator for generating a reference voltage;

a comparator with its one terminal applied by the voltage at the drain connected in common to the PMOS transistor and the NMOS transistor and the other terminal thereof applied by the reference voltage of the reference voltage generator;

a sense amplifier driving determinator for determining whether to receive and program 2-bit information during the programming and stopping the operation of the comparator and the voltage controller during completion of the programming;

a register array having the same number of registers as the number of information bits of a cell array for one sense amplifier to process so as to provide the 2-bit information to the sense amplifier driving determinator at respective steps during the reading; and a counter unit for generation an 2-bit output for determining the data being stored in the register array at respective steps during the read mode.

2. The circuit of claim 1, wherein the voltage controller comprises:

a first PMOS transistor with its source applied by the programming voltage and its gate connected in common;

a second PMOS transistor with its gate and drain connected in common;

a first NMOS transistor with its gate connected to the drain of the selected cell and its drain connected to the drain of the first PMOS transistor;

a second NMOS transistor with its gate applied by a clamp voltage and its drain connected to the drain of the second PMOS transistor; and a third NMOS transistor with its gate applied by a voltage control enable signal, its drain connected to the source of the first NMOS transistor and the second NMOS transistor connected in common by the source and its source connected to ground voltage.

3. The circuit of claim 1, wherein the reference voltage generator comprises:

a PMOS transistor with its source applied to the programming voltage, its gate and drain connected in common to an input terminal of the comparator; and a reference cell with its gate applied to a control gate voltage, its drain connected to the drain of the PMOS transistor and its source connected to ground voltage.

4. The circuit of claim 1, wherein the comparator is driven by the programming voltage and includes a differential amplifier with its one terminal applied by the reference voltage VREF of the reference voltage generator and the other terminal thereof applied by a cell voltage.

5. The circuit of claim 1, wherein the sense amplifier driving determinator comprises:

a sense amplifier enable signal generator for receiving 2-bit data from the register array during the programming and outputting a sense amplifier enable signal;

a latch unit for latching the sense amplifier enable signal of the sense amplifier enable signal generator;

a NAND gate for NANDing an output of the comparator, an output of the latch unit and a programming/reading mode selection signal and outputting a switching enable signal;

an AND gate for ANDing the output of the comparator and the programming/reading mode selection signal;

a first NMOS transistor with its drain applied by the sense amplifier enable signal, its gate applied by an output of the AND gate and its source connected to the ground voltage;

a second NMOS transistor with its gate applied by the output of the latch unit, its drain connected to the gate of the second NMOS transistor of the voltage controller and its source connected to the ground voltage;

a third NMOS transistor with its gate applied by the output of the latch unit, its drain applied to the gate of the NMOS transistor and its source applied to the ground voltage; and an inverter for inverting the output of the latch unit and outputting a voltage control enable signal.

6. The circuit of claim 5, wherein the sense amplifier enable signal generator comprises:

a first transmission gate for being controlled by a first level enable signal and its inverted signal and selectively outputting the supply voltage;

a NAND gate for NANDing the most significant bit and the least significant bit of the register array;

a second transmission gate for controlling the output of the NAND gate by a second level enable signal and its inverted signal and selectively outputting the result;

an inverter for inverting the most significant bit, a third transmission gate for controlling the output of the inverter by a third level enable signal and its inverted signal and selectively outputting the result;

a NOR gate for NORing the most significant bit and the least significant bit; and a fourth transmission gate for controlling the output of the NOR gate by a fourth level enable signal and its inverted signal and selectively outputting the result.

* * * * *